United States Patent
Teowee et al.

(10) Patent No.: US 12,529,550 B2
(45) Date of Patent: Jan. 20, 2026

(54) INTEGRATED DETONATOR SENSORS

(71) Applicant: AUSTIN STAR DETONATOR COMPANY, Cleveland, OH (US)

(72) Inventors: Gimtong Teowee, Westlake Village, CA (US); John David Rathbun, Hunting Valley, OH (US); Larry S. Howe, Norwalk, OH (US); Walter Jacob Harders, Rocky River, OH (US)

(73) Assignee: Austin Star Detonator Company, Cleveland, OH (US)

( * ) Notice: Subject to any disclaimer, the term of this patent is extended or adjusted under 35 U.S.C. 154(b) by 0 days.

(21) Appl. No.: 18/778,335

(22) Filed: Jul. 19, 2024

(65) Prior Publication Data

US 2024/0373734 A1 Nov. 7, 2024

Related U.S. Application Data

(63) Continuation of application No. 17/797,807, filed as application No. PCT/US2021/015904 on Jan. 29, 2021, now Pat. No. 12,044,516.

(Continued)

(51) Int. Cl.
| | |
|---|---|
| *F42D 1/05* | (2006.01) |
| *E21B 43/1185* | (2006.01) |
| *E21B 47/07* | (2012.01) |
| *F42C 19/08* | (2006.01) |
| *H10K 59/12* | (2023.01) |
| *H10K 59/127* | (2023.01) |
| *H10K 59/131* | (2023.01) |
| *H10K 59/80* | (2023.01) |
| *H10K 71/80* | (2023.01) |
| *H10K 77/10* | (2023.01) |
| *H10K 102/00* | (2023.01) |

(52) U.S. Cl.
CPC ...... *F42C 19/0807* (2013.01); *E21B 43/1185* (2013.01); *E21B 47/07* (2020.05); *F42D 1/05* (2013.01); *H10K 59/1201* (2023.02); *H10K 59/127* (2023.02); *H10K 59/131* (2023.02); *H10K 59/873* (2023.02); *H10K 71/80* (2023.02); *H10K 77/111* (2023.02); *H10K 2102/311* (2023.02)

(58) Field of Classification Search
CPC ........ F42D 1/05; F42D 1/045; E21B 43/1185; E21B 43/11857; F42C 11/02
See application file for complete search history.

(56) References Cited

U.S. PATENT DOCUMENTS

| | | | |
|---|---|---|---|
| 6,273,187 B1 * | 8/2001 | Voisin, Jr. | E21B 34/06 166/376 |
| 7,804,223 B1 * | 9/2010 | Teowee | F42C 9/147 310/318 |

(Continued)

*Primary Examiner* — Jonathan C Weber
(74) *Attorney, Agent, or Firm* — Lippes Mathias LLP

(57) ABSTRACT

A detonator includes a substrate, a controller mounted to the substrate, and a sensor coupled to the controller to measure a temperature, pressure, acceleration or other environmental parameter of the detonator. The controller is configured to transmit the measured environmental parameter from the detonator to a remote master controller, execute an action in response to a value of the measured environmental parameter, and/or prevent or modify at least one detonator function in response to the value of the measured environmental parameter.

18 Claims, 13 Drawing Sheets

Related U.S. Application Data

(60) Provisional application No. 62/970,760, filed on Feb. 6, 2020.

(56) References Cited

U.S. PATENT DOCUMENTS

| | | | |
|---|---|---|---|
| 9,890,620 B2* | 2/2018 | Maxted | F42C 15/20 |
| 2005/0178282 A1* | 8/2005 | Brooks | F42D 1/055 |
| | | | 102/202.7 |
| 2009/0272529 A1* | 11/2009 | Crawford | E21B 43/1185 |
| | | | 166/250.15 |
| 2012/0012019 A1* | 1/2012 | Harding | G04F 10/00 |
| | | | 368/9 |
| 2014/0053750 A1* | 2/2014 | Lownds | F42D 1/05 |
| | | | 361/248 |
| 2015/0000509 A1* | 1/2015 | Current | E21B 43/11 |
| | | | 89/1.15 |
| 2015/0013560 A1* | 1/2015 | Schlenter | F42C 11/008 |
| | | | 102/202.14 |
| 2016/0237794 A1* | 8/2016 | Maxted | F42B 3/182 |
| 2017/0328696 A1* | 11/2017 | Muller | F42D 1/05 |
| 2019/0368321 A1* | 12/2019 | Eitschberger | E21B 23/10 |
| 2020/0200516 A1* | 6/2020 | Zemla | F42D 1/045 |

\* cited by examiner

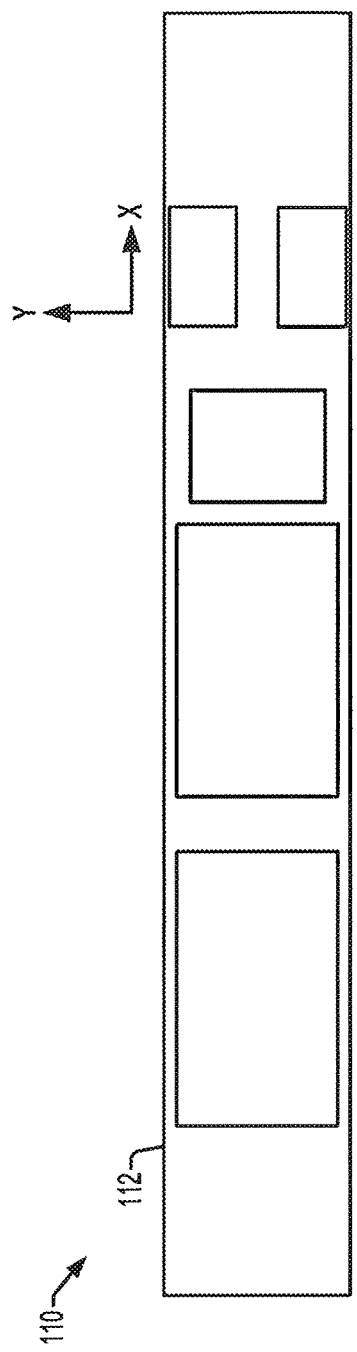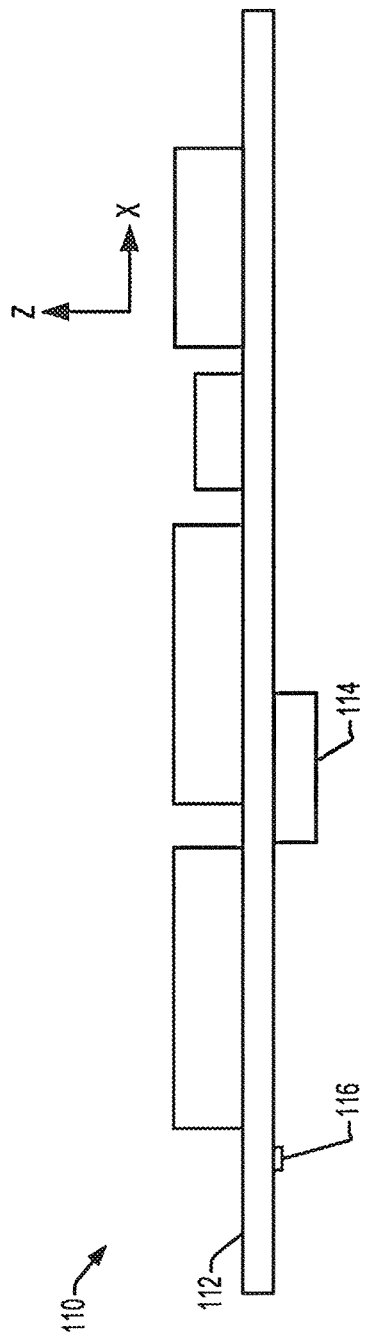

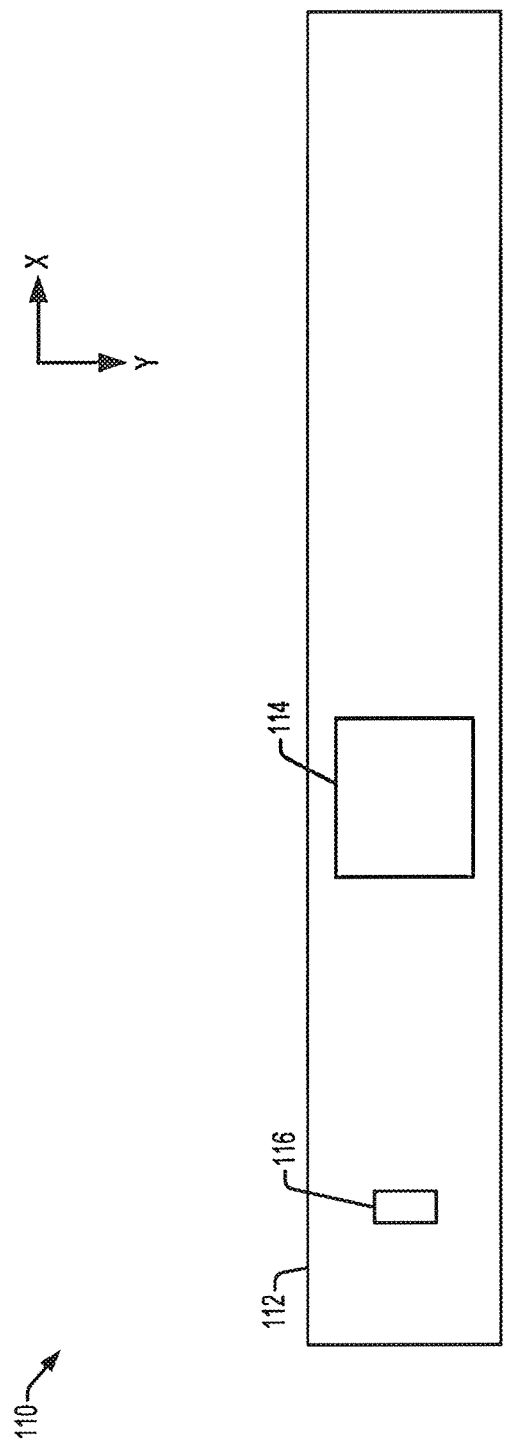

INTEGRATED DETONATOR SENSORS

BACKGROUND

Blasting systems include apparatus to detonate explosive charges positioned in specific locations. Detonators and explosives are buried in the ground, for example, in holes (e.g., bore holes) drilled into rock formations, etc. The detonators are wired for external access to wired or wireless master controllers or blasting machines that provide electrical firing signaling to initiate detonation of the explosives. The blasting machine is wired to an array of detonators, and some blasting systems include a remotely located master controller and a local slave device connected to the blasting machine at the blast site. In wireless blasting systems, no wiring or lead lines are connected between the detonator array and the master controller, and the master controller can be positioned a significant distance from the blast site. A blast sequence may include power up, verification and/or programming of delay times, arming and issuance of a fire command. The blasting machine provides enough energy and voltage to charge firing capacitors in the detonators, and initiates the actual detonator firing in response to the fire command. During the firing phase, upon operator input at the master controller, a fire command is transferred from the master to the slave which then issues the final command to the blasting machine in order to fire the detonators. Sensors are sometimes used, especially temperature sensors, outside the detonators, typically in wireline applications. In wireline applications, a temperature sensor can be inserted outside the detonator and external to perforating guns, sometimes in their own sub or container. Perforating guns are wellbore tools that are lowered own into a wellbore and when at a desired depth or location, the detonator(s) is/are set off to initiate the shaped charges along the sides of the gun to make perforations to allow gas or oil to flow into the wellbore and to the surface. The sub is a unit within a toolstring lowered into the wellbore. However, the measured temperature data from external sensors may not accurately reflect the actual temperature of the detonator.

SUMMARY

Detonators are disclosed with one or more integrated environ mental sensors, and methods are disclosed for measuring environmental parameters in a detonator. A detonator is described, having a substrate, a controller mounted to the substrate, and a sensor coupled to the controller to measure a temperature, pressure, acceleration or other environmental parameter of the detonator. In one example, the substrate is a printed circuit board, and the sensor is mounted to the substrate. The controller in one example stores the measured environmental parameter, transmits the measured environmental parameter from the detonator to a remote master controller, executes an action in response to a value of the measured environmental parameter, and/or prevents or modifies a detonator function in response to the value of the measured environmental parameter.

The detonator in one example includes an enclosure, such as a molded plastic housing, heat shrink tubing, etc. that encloses the controller, the sensor, and a portion of the substrate.

In one example, the integrated sensor has a sensor output coupled to an input of the controller, for example, an input of an analog to digital converter (ADC or A/D) configured to convert a signal from the sensor output. In one example, the sensor is a temperature sensor, such as a thermocouple, RTD, thermistor, etc. In one implementation, the sensor provides a voltage divider having a first resistor with a first terminal coupled to a sensor input of the sensor, and a second terminal coupled to the sensor output, as well as a thermistor having a first terminal coupled to the sensor input, and a second terminal coupled to a reference node. In another example, the sensor is a pressure sensor that includes a piezoelectric component having a first terminal and a second terminal, as well as a bridge rectifier or other diode circuit. In another example, the sensor is an accelerometer.

In another aspect of the present disclosure, a method includes measuring an environmental parameter (temperature, pressure, acceleration) of a detonator using a sensor inside an enclosure of a detonator. The method also includes, using a controller of the detonator, at least one of: transmitting the measured environmental parameter from the detonator to a remote master controller; executing an action in response to a value of the measured environmental parameter; and preventing or modifying at least one detonator function in response to the value of the measured environmental parameter. In one example, the method includes determining whether an environmental profile has been reached based on the multiple samples of the measured environmental parameter, and in response to the environmental profile having been reached, at least one of: executing the action and preventing or modifying the at least one detonator function using the controller.

BRIEF DESCRIPTION OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages and novel features of the disclosure will be set forth in the following detailed description of the disclosure when considered in conjunction with the drawings.

FIG. 3 is a top plan view of the detonator of FIG. 2.

FIG. 4 is a side elevation view of the detonator of FIGS. 2 and 3.

FIG. 5 is a bottom plan view of the detonator of FIGS. 2-4.

DETAILED DESCRIPTION

Figure 1:
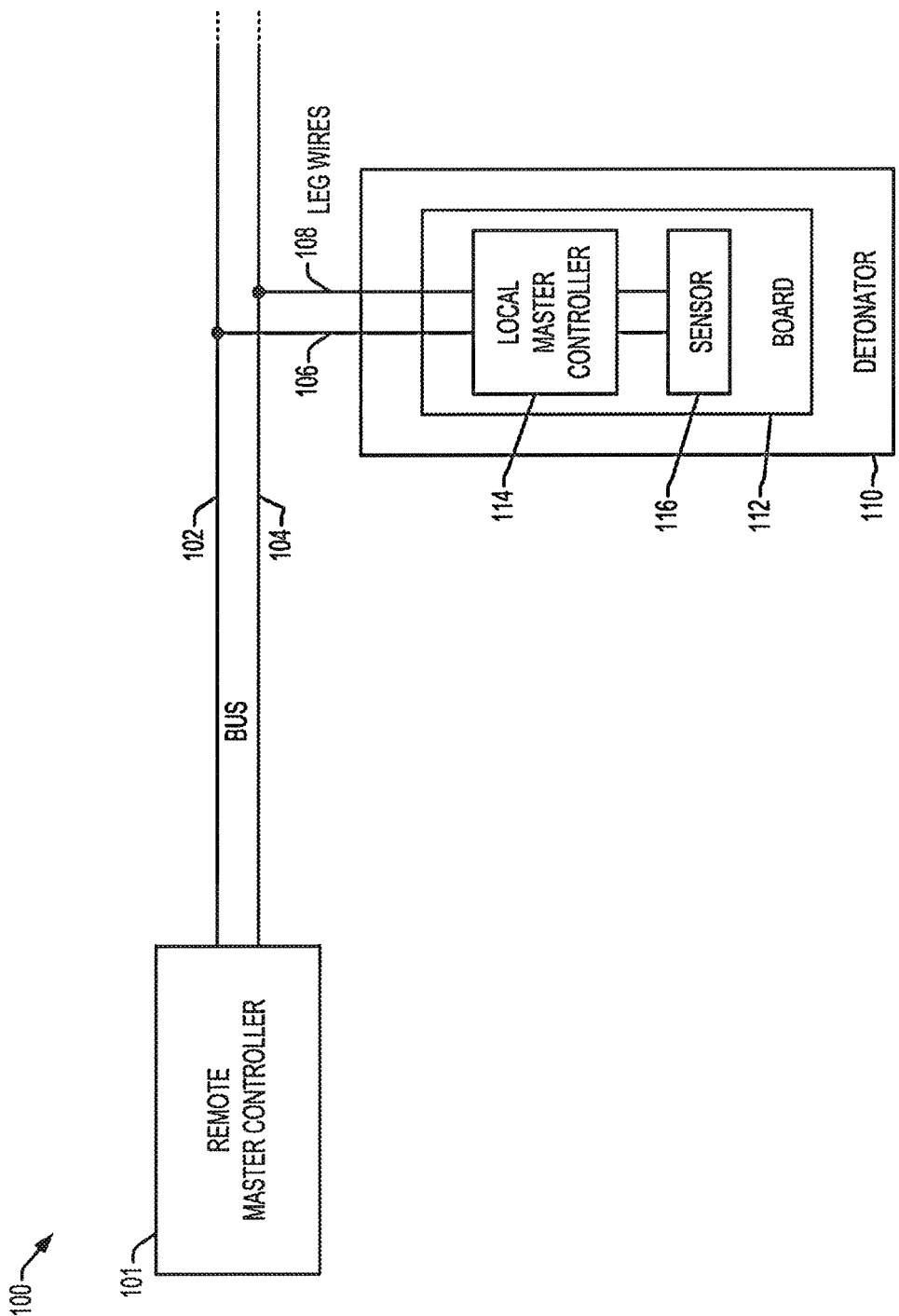
FIG. 1 is a schematic diagram illustrating a detonator with an integrated sensor in a blasting system.
Figure 2:
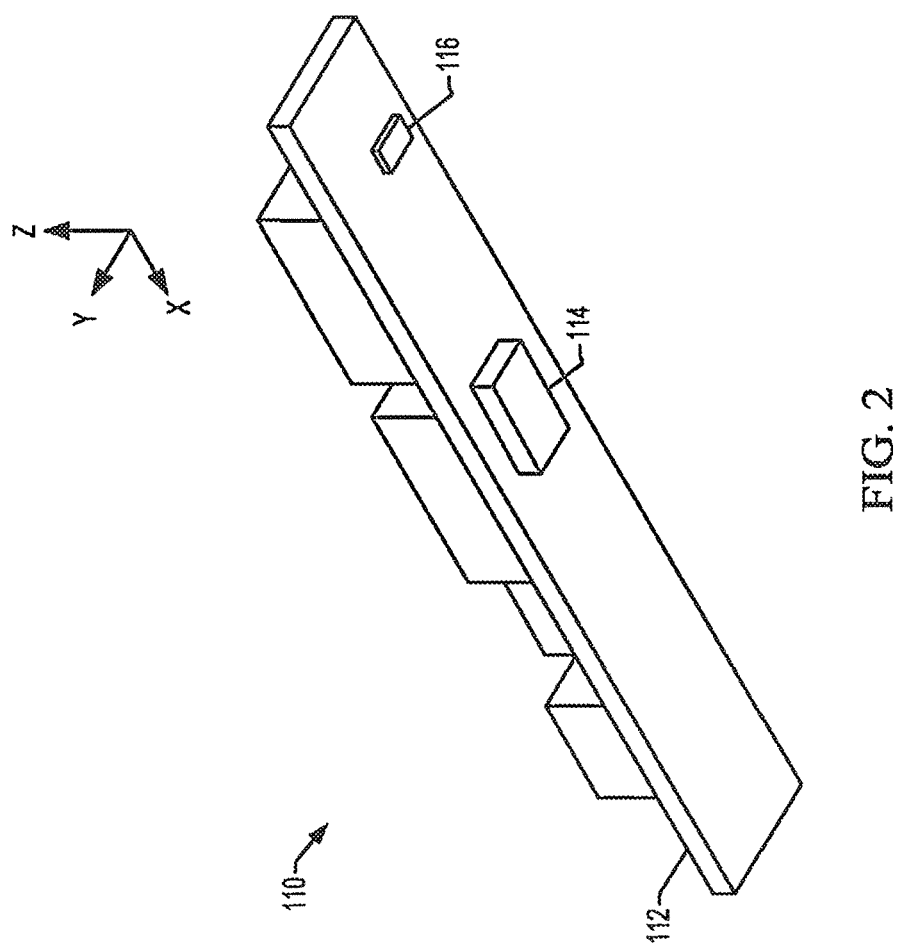
FIG. 2 is a bottom perspective view of a detonator with an integrated sensor mounted on a printed circuit board substrate.

Referring now to the figures, several embodiments or implementations of the present disclosure are hereinafter described in conjunction with the drawings, wherein like reference numerals are used to refer to like elements throughout, and wherein the various features and plots are not necessarily drawn to scale. Measured environmental parameters can indicate environmental impact on pyrotechnics, explosives in a base charge, and/or electronics of the detonator. Environmental detonator history profile data may be useful in identifying safety concerns while retrieving misfired perforating guns to the surface, for example, to know the thermal, pressure, and/or acceleration seen by the detonator while inside a perforating gun. Disclosed detonators and methods advantageously provide integrated detonator sensors and associated environmental parameters measured at or near the detonator to facilitate safety evaluation, and other analysis. As used herein, the terms "couple" or "couples" or "coupled" are intended to include indirect or direct electrical or mechanical connection or combinations thereof. For example, if a first device couples to or is coupled with a second device, that connection may be through a direct electrical connection, or through an indirect electrical connection via one or more intervening devices and connections.

FIG. 1 shows a blasting system 100 with an electronic detonator 110 that includes an integrated sensor 116, for example, a temperature sensor, a pressure sensor, an accelerometer, etc. The system 100 includes a remote master controller 101 with connections to a bus having first and second bus wires 102 and 104, respectively. The detonator 110 includes connections to first and second leg wires 106 and 108, respectively coupled to the first and second bus wires 102 and 104. The detonator 110 includes a local master controller 114 coupled to the sensor 116. In one example, the controller 114 is mounted to a substrate, such as a printed circuit board (PCB) 112. In one implementation, the detonator 110 includes more than one sensor 116. In one example, the sensor 116 is mounted to the PCB 112. In another implementation, the sensor 116 is wired to electrical connections of the PCB 112 (e.g., FIG. 14 below). In certain implementations, the detonator 110 includes an enclosure (e.g., FIGS. 10-13 below), and the sensor 116 is positioned at least partially inside the enclosure. The detonator 110 in one example is positioned inside a perforating gun or other outer enclosure (not shown).

Referring also to FIGS. 2-6, one example of the detonator 110 includes various electrical or electronic components mounted to a two-sided PCB 112, including components that form an electronic ignition module (EIM) used in electronic detonators. In this example, the controller 114 is a processor, application-specific IC (ASIC), microcontroller, DSP, FPGA, CPLD, or other integrated circuit or circuits with processing circuitry and electronic memory. In one example, the electronic memory is non-volatile, and the controller 114 is configured to store multiple measured environmental parameters, historical data, and other data associated with the detonator 110. In certain implementations, the controller 114 also includes interface circuitry, such as analog to digital converters, digital-to-analog converters, communication interface circuits, etc. The controller 114 may also include digital interface circuitry, such as data and/or address buses, serial communications circuits, pulse width modulation outputs, etc. For example, the example controller 114 includes serial communications interface circuitry to provide communications with the remote master controller 101 via the bus lines 102, 104 and the leg wire's 106, 108 in FIG. 1.

In the example detonator 110 of FIGS. 2-5, the controller 114 and the sensor 116 are mounted to a bottom side of the PCB 112. The PCB 112 in this example includes input terminals and output terminals (not shown) at opposite ends of the PCB 112 to be coupled to leg wires (e.g., leg wires 106 and 108 in FIG. 1). In addition, the sensor 116 is coupled to the controller 114 (e.g., FIGS. 1 and 6).

Figure 6:
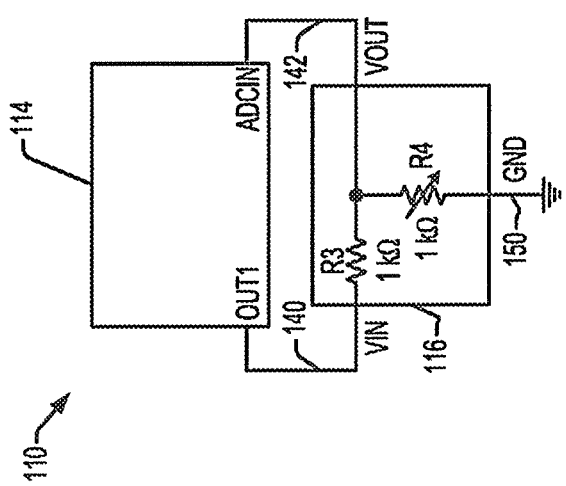
FIG. 6 is a schematic diagram illustrating circuitry in the detonator of FIGS. 2-5.

FIG. 6 shows one example of a temperature sensor 116, such as a Microchip MCP9700 or 9701 connected to an input voltage VIN at an output terminal 140 (OUT1) of the controller 114. In this example, the sensor 116 includes a sensor output 142 coupled to provide a sensor output signal VOUT to an input (ADCIN) of the controller 114. In this example, the sensor 116 includes a resistive voltage divider circuit that provides an analog voltage signal VOUT, and the input of the controller 114 is connected to an internal analog to digital converter (ADC) configured to convert a signal from the sensor output 142. The sensor 116 in this example includes a first resistor R3 having a first terminal coupled to a sensor input 140 of the sensor 116, and a second terminal coupled to the sensor output 142, as well as a negative temperature coefficient (NTC) thermistor R4 having a first terminal coupled to the sensor input 140, and a second terminal coupled to the ground reference node 150. In one example, the resistors R3 and R4 are of generally equal resistances (e.g., 1 kΩ) at a nominal temperature (e.g., 25° C.), and the resistance of the thermistor R4 decreases with increasing detonator temperature. In other implementations, a positive temperature coefficient (PTC) resistive device R4 can be used.

In one example, the detonator 110 includes a thermal (e.g., temperature) sensor 116 as shown in FIGS. 2-6. Other implementations are possible including pressure sensors, accelerometers, or other environmental sensors alone or in combination with one or more temperature sensors. The example of FIGS. 2-6 includes an integrated temperature sensor 116 mounted to the PCB 112. In other implementations, the sensor 116 is not mounted directly to the substrate 112, but is wired to the circuitry of the controller (e.g., FIG. 14 below). The sensor or sensors is/are preferably mounted in somewhat close proximity to the detonator 110, for example, inside or at least partially inside an enclosure (e.g., package or shell) of the detonator 110. The sensor 116 is operatively coupled to the local master controller 114, and to the remote master controller 101 (FIG. 1) to facilitate communication of measured environmental parameters for local processing at the detonator controller 114 and/or at the remote master controller 101. In one example, the local master controller 114 (e.g. microcontroller, ASIC, FPGA, CPLD, etc.) is configured by suitable programming instructions to control the temperature (and/or other environmental) measurements through active command or background operation. The interfacing of sensor 116 to the local master controller 114 and/or to the remote master controller 101 in one example is implemented using serial communications circuitry and protocols such as I2C, SPI, UART, CAN, SMbus, etc. or via an ADC read of the analog output of the sensor 116 (e.g., FIG. 6). In certain implementations, moreover, the local detonator controller 114 implements direct power control to turn on the environmental sensor or sensors 116 on or off to save power consumption. In a normal state the sensor 116 is off, and whenever a temperature or other environmental reading is required according to programming instructions in the detonator 110, the controller 114 applies power to an appropriate input of the sensor 116 (e.g., VIN in FIG. 6). Selective power management, in this regard, can be used with active and/or passive examples of environmental sensors 116 in various implementations.

In one example, the temperature or other environmental readings are initiated by demand from the remote master controller 101 via communications between the controllers 101 and 114 along the bus lines 102, 104 and the leg wires 106, 108. In another implementation, the controller 114 initiates environmental readings continuously in the background at some predetermined regular periods. In one implementation, the local master controller 114 relays readings from the sensor 116 to the remote master controller 101 in response to the readings indicating that one or more environmental parameters (e.g., temperature) has exceeded a predetermined threshold, or in response to the controller 114 determining that multiple readings indicate that a thermal or other environmental profile has been met or exceeded. In this regard, the local master controller 114 in one example is configured by suitable program instructions to perform one or more computations on multiple readings from the sensor 116, for example, to determine environmental levels, environmental level profiles, environmental level rates of change, or other computed values that represent an environmental condition of the detonator 110.

In one implementation, the local master controller 114 can take one or more actions or modify one or more detonator functions in response and/or based on the readings from the sensor 116. In one example, depending on the temperature/pressure/acceleration and/or a range/window of temperature/pressure/acceleration and/or a temperature/pressure/acceleration rise or fall rate, the local master controller 114 is configured to take one or more of the following actions and/or function modification: above a temperature/pressure/acceleration value or values, the detonator 110 will not be able to function; below a temperature/pressure/acceleration value or values, the detonator 110 will be able to function, e.g., an oil well detonator can be fired when a higher temperature/pressure/acceleration (typical of subterranean wellbore condition) is detected to avoid firing at surface; and/or when a thermal/pressure/acceleration profile of the detonator 110 exceeds a predetermined window, the controller 114 transmits a warning signal or error message to the remote master controller 101 to indicate this condition, and appropriate action can be taken by the blaster or operator at the remote master controller 101.

In one example, using an integrated temperature sensor 116, the controller 114 sounds a warning (e.g., via communications to the remote master controller 101) when a critical elevated temperature has been, or almost reached for safety of the electronics or pyrotechnics of the detonator 110. The controller 114 in one example only allows certain functioning, e.g., charging firing capacitors or firing, when a temperature/pressure/acceleration has been reached or when a range of the temperature/pressure/acceleration has been achieved. The controller 114 in one example obtains a thermal history exposure and determines whether any critical thermal profile has been breached to initiate a warning to the remote user at the remote controller 101, for example, during retrieval of the detonator 110. The controller 114 in one example determines whether any functioning of the detonator 110 needs to be modified in view of the elevated temperature, e.g., reduced maximum delay time at higher temperature/pressure/acceleration.

The sensor 116 in one example is a compact, small form factor and footprint to be able to fit into the detonator shell or enclosure. In one example, the sensor 116 is mounted onto a PCB substrate 112 (e.g., FIGS. 2-5) together with other electronic components, and the detonator PCB assembly is inserted into the shell or enclosure after base charge loading. In one example, a temperature sensor 116 is used, such as a passive component, e.g., an NTC (negative temperature coefficient) resistor or thermocouple, or an active sensor 116 can be used, e.g., MCP 9700 Temperature Sensor IC or LM73. Examples of compact accelerometer sensors include ADXL 335, KX003-1077 and LIS2HH12.

Figure 7:
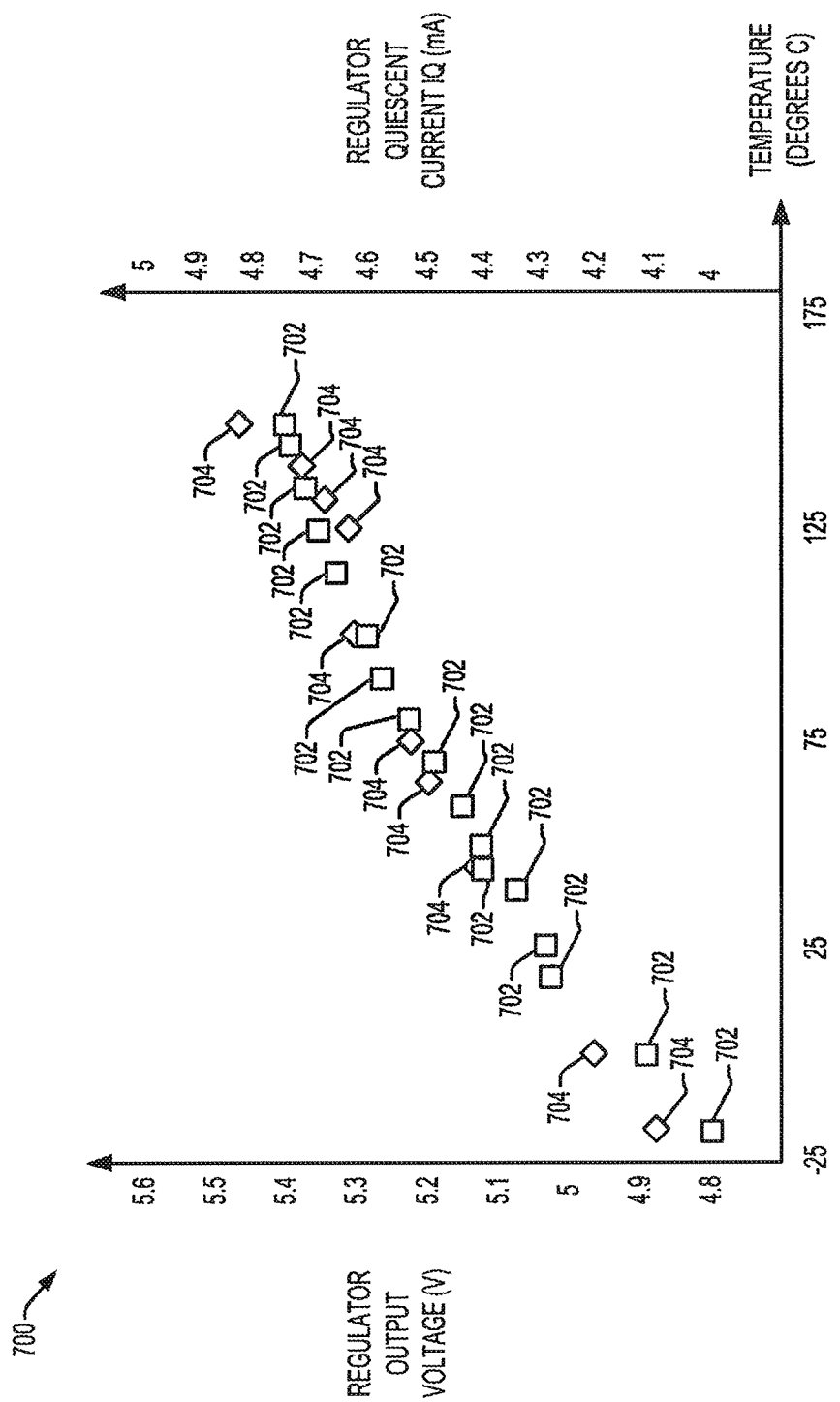
FIG. 7 is a graph of detonator voltage and current as a function of temperature.

Referring also to FIG. 7, in another example, the environmental sensor 116 can be implemented as a thermally sensitive output of another circuit, such as a voltage regulator that tracks well with temperature. FIG. 7 shows a graph 700 of detonator voltage and current as a function of temperature, in this example, including a curve or set of data points 702 showing the output voltage and a curve or set of data points 704 showing the quiescent current of an integrated MCP9700 power supply regulator circuit on the PCB substrate 112 that tracks with the temperature of the detonator 110. The graph 700 and the following table show regulator output voltage values 702 and quiescent current values 704.

Regulator Output and IQ as Function of Temperature

| Operating voltage/current VS temperature | | |
|---|---|---|
| T degrees C. | V | mA |
| −17 | 4.8 | 4.1 |
| 1 | 4.89 | 4.21 |
| 19 | 5.025 | |
| 27 | 5.033 | |
| 40 | 5.075 | |
| 45 | 5.10 | 4.42 |
| 50 | 5.124 | |
| 60 | 5.152 | |
| 65 | | 4.5 |
| 70 | 5.192 | |
| 75 | | 4.53 |
| 80 | 5.225 | |
| 90 | 5.263 | 4.63 |
| 100 | 5.281 | 4.63 |
| 115 | 5.327 | |
| 125 | 5.350 | 4.64 |
| 132 | | 4.68 |
| 135 | 5.370 | |
| 140 | | 4.72 |
| 145 | 5.390 | |
| 150 | 5.4 | 4.83 |

In one example, the controller 114 includes an analog to digital converter input coupled to a sensed regulator output voltage or a sensed regulator quiescent current and performs linear interpretation or other curve fitting techniques to derive a corresponding temperature value that is stored and/or reported to the remote master controller 101 as the detonator temperature.

Figure 8:
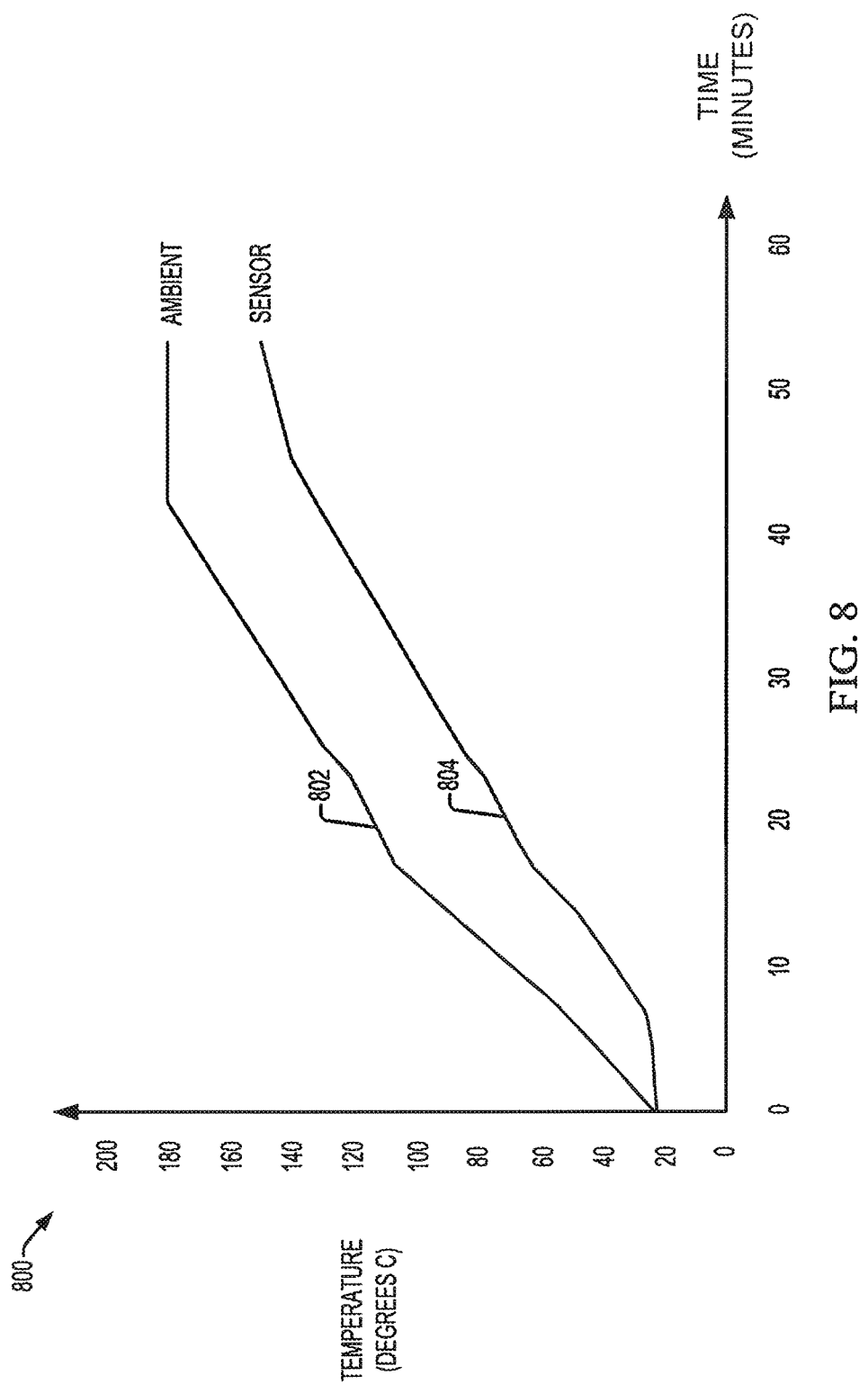
FIG. 8 is a graph of detonator ambient temperature and integrated sensor temperature as a function of time.

FIG. 8 shows a graph 800 that includes a curve 802 showing the ambient detonator temperature, and a curve 804 showing a sensed temperature reading from the integrated temperature sensor 116 (e.g., a Microchip MCP 9700 or 9701 as a function of time. As shown in FIGS. 8, the ambient temperature outside the detonator enclosure can deviate significantly from the detonator temperature itself. The illustrated and described examples include integrated temperature (e.g., and/or pressure and/or acceleration) sensors 116 positioned within the detonator enclosure to provide a more accurate reading of the actual temperature to which the detonator 110 and its electronics and pyrotechnics are exposed.

Figure 9:
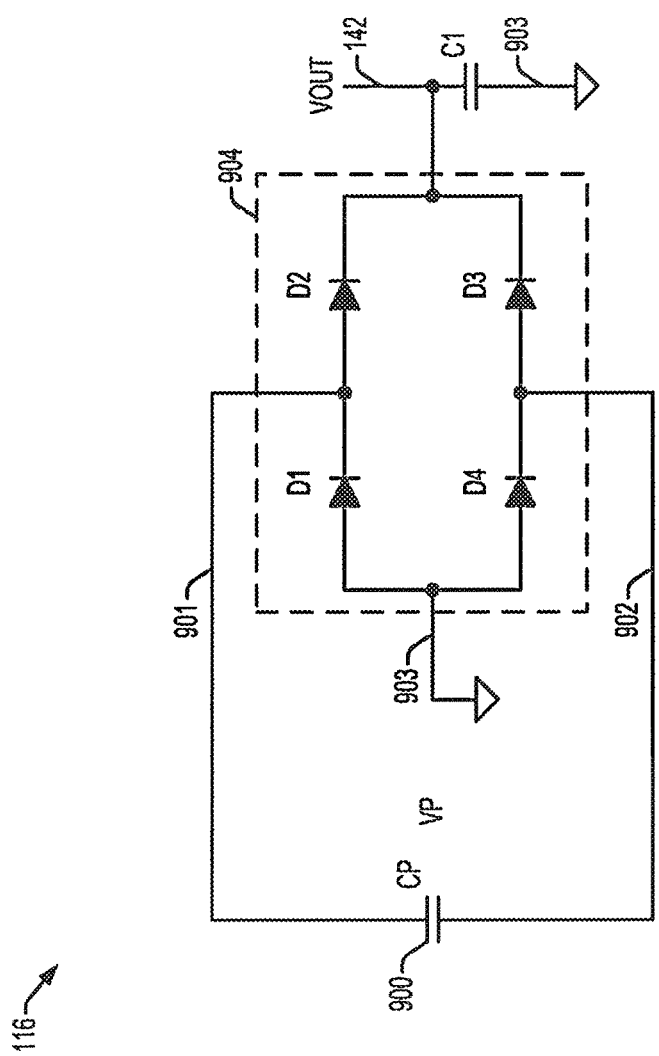
FIG. 9 is a schematic diagram illustrating another example detonator circuit with an integrated piezoelectric capacitor pressure sensor.
Figure 10:
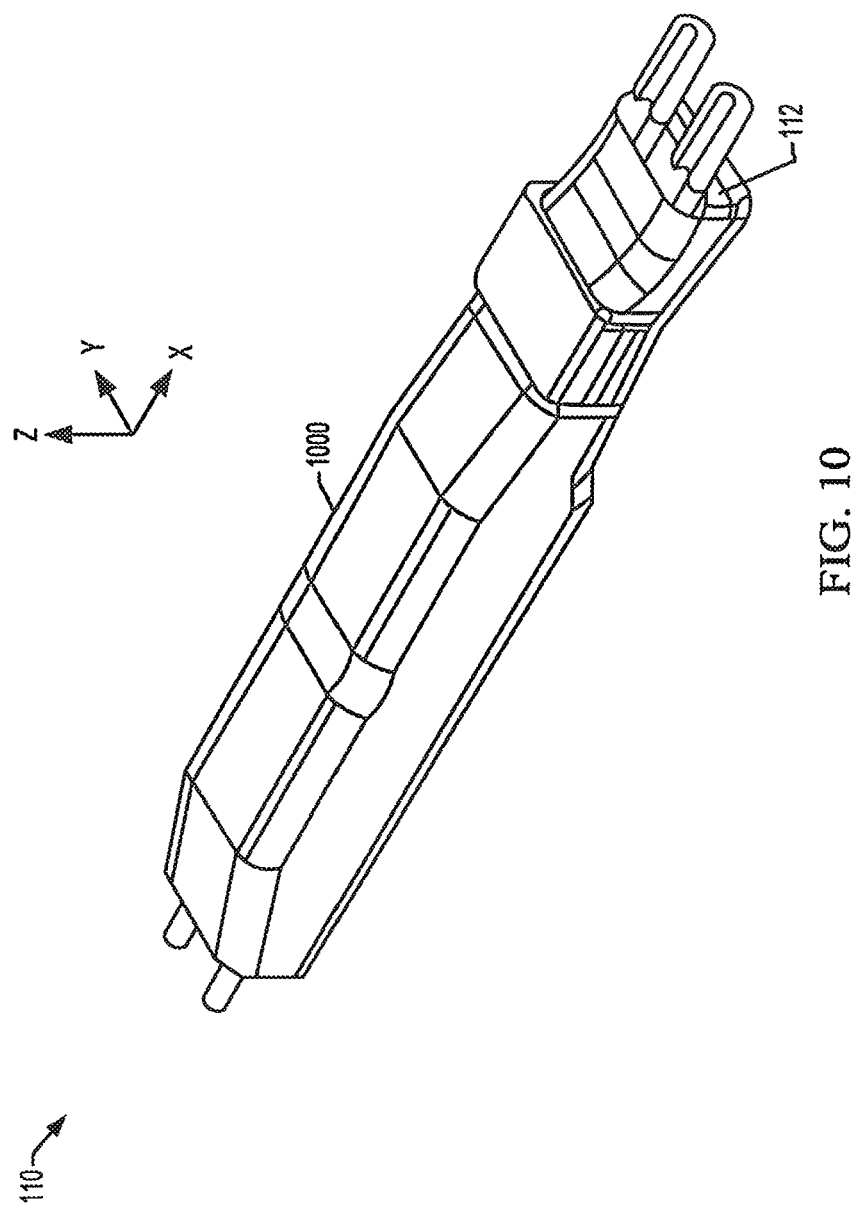
FIG. 10 is a top perspective view of the detonator of FIGS. 2-5 enclosed in a shrink wrap package.
Figure 11:
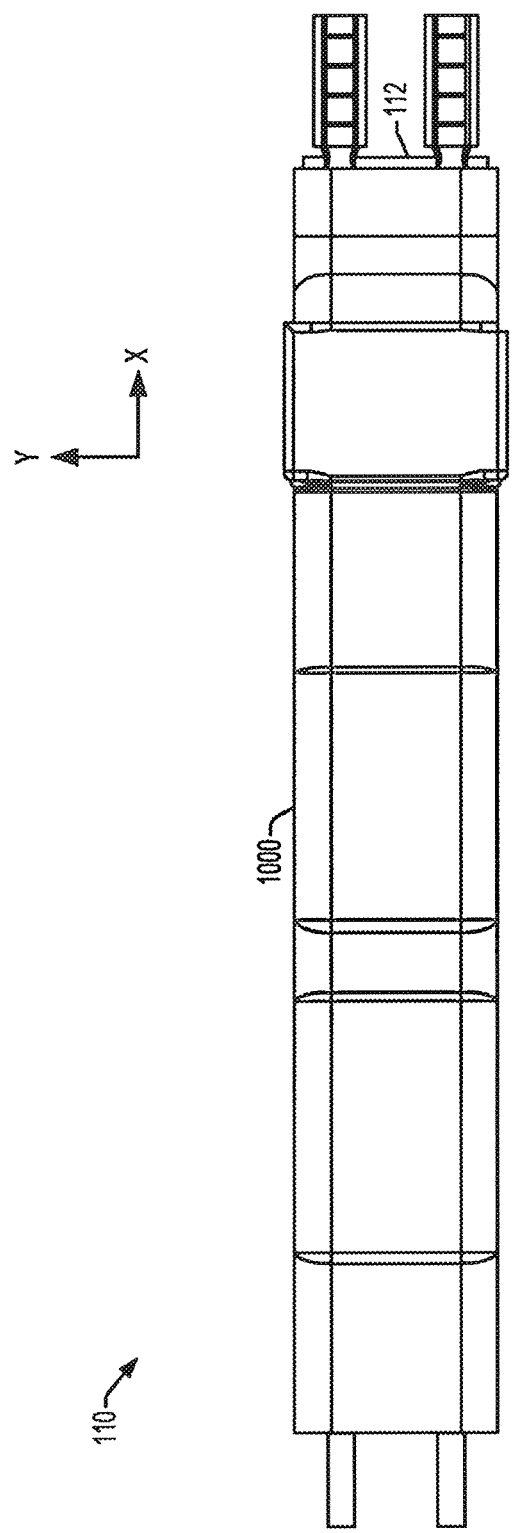
FIG. 11 is a top plan view of the detonator of FIGS. 2-5 and 10.
Figure 12:
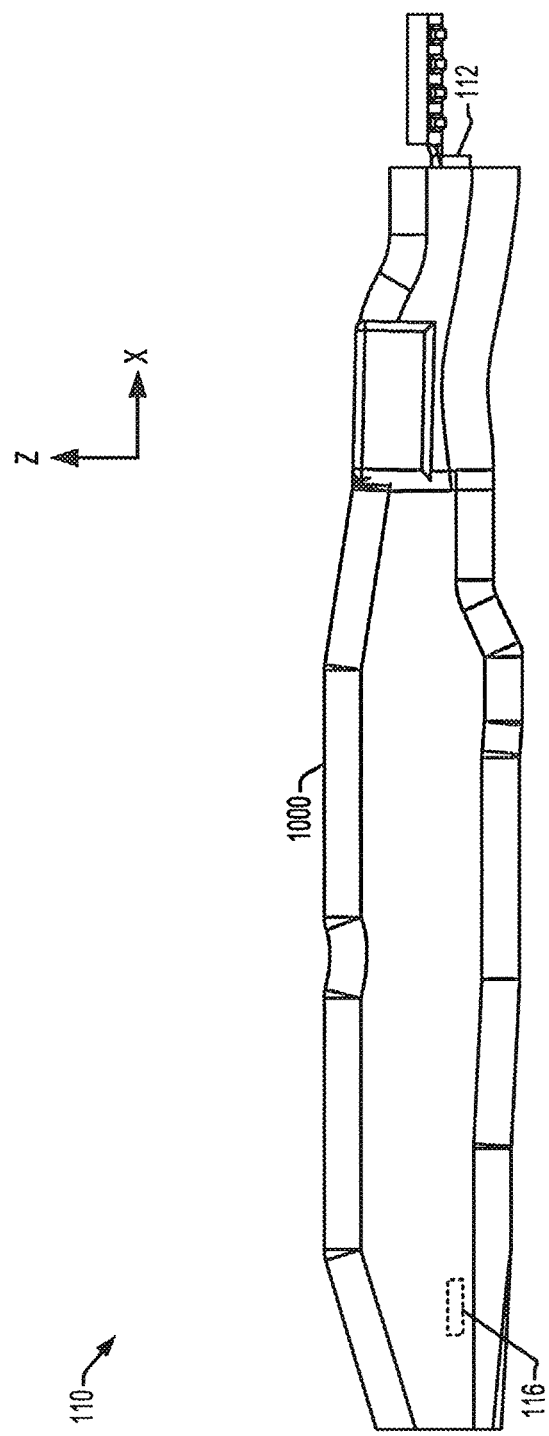
FIG. 12 is a side elevation view of the detonator of FIGS. 2-5, 10 and 11.
Figure 13:
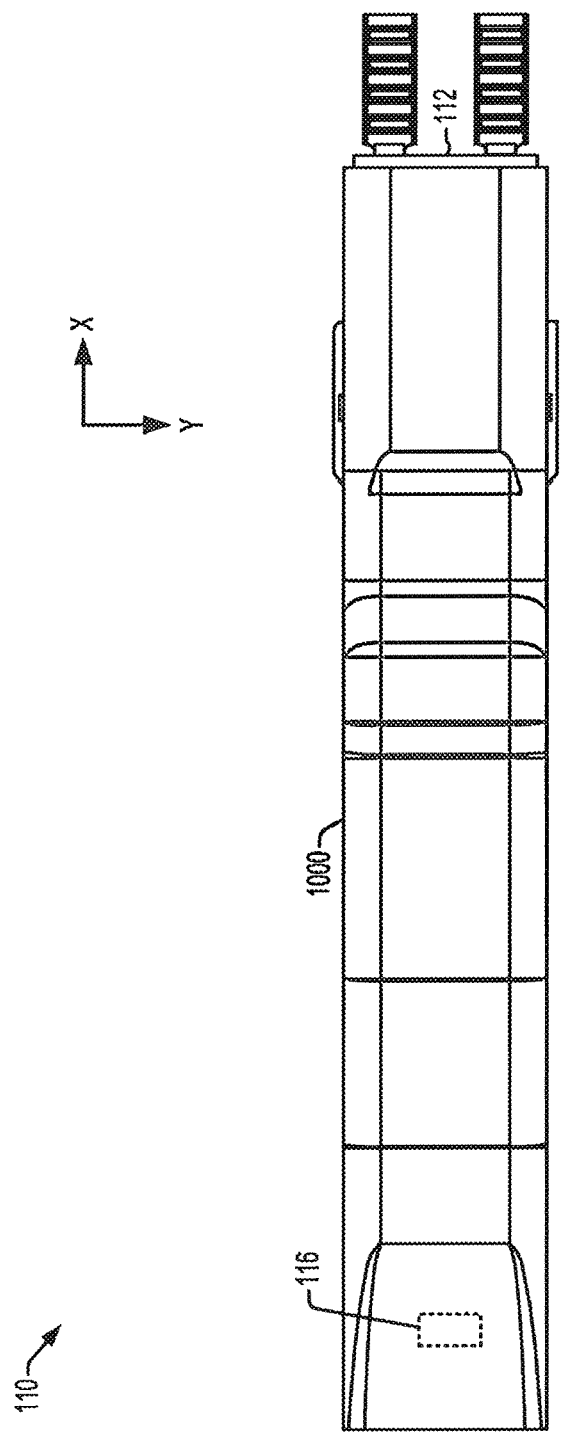
FIG. 13 is a bottom plan view of the detonator of FIGS. 2-5 and 10-12.

Referring also to FIG. 9, in other implementations, the detonator 110 includes an integrated pressure sensor 116, and the controller 114 makes or obtains pressure measurements using the sensor 116, and stores and/or transmits detonator pressure data over the communications lines 102, 104, 106 and 108 to the remote master controller 101. In certain implementations, the controller 114 executes one or more actions in response to pressure data and/or profiles derived or computed from the data, such as determining from pressure sensing prior to the actual programmed delay time that excessive pressure waves may develop before the adjacent detonations, and taking appropriate action, e.g. either shutdown, or fire the detonator immediately to avoid misfire due to such excessive pressure wave damaging the firing electronics of the detonator 110.

FIG. 9 shows another example detonator circuit with an integrated piezoelectric capacitor pressure sensor 116. The sensor 116 in this example includes a piezoelectric component 900, e.g., a capacitor with a nominal capacitance CP and a piezoelectric voltage VP that varies with temperature. The piezoelectric component 900 has a first terminal 901 and a second terminal 902. The pressure sensor 116 in this example also includes a diode rectifier circuit 904 with diodes D1-D4 that rectifies the piezoelectric voltage VP to provide an output voltage signal VOUT that represents the pressure sensed by the piezoelectric capacitor pressure sensor 116. The example diode circuit 904 includes a first diode D1 having an anode coupled to a reference node 903, and a cathode coupled to the sensor input 140, as well as a second diode D2 having an anode coupled to the sensor input 140, and a cathode coupled to the sensor output 142. The diode circuit 904 also includes a third diode D3 having an anode coupled to the second terminal 902 of the piezoelectric component 900, and a cathode coupled to the sensor output 142, and a fourth diode D4 having an anode coupled to the reference node 903, and a cathode coupled to the second terminal 902 of the piezoelectric component 900. An output capacitor C1 is coupled between the reference node 903 and the output node 142 in one example. A simple pressure sensor 116 in this example includes a capacitor containing piezoelectric materials, which can be coupled directly to a bridge rectifier 904 and to the controller 114 which can sense the charge and translate the output voltage VOUT into voltage sensed as a function of the detonator pressure magnitude. The example piezoelectric sensor can be coupled via the bridge rectifier 904 to a storage firing capacitor (not shown) to store additional energy, harvesting the pressure waves transducing into charge to assist in firing the detonator 110. This extra firing energy can increase the max delay time, or be used as extra firing energy during detonator firing for added reliability.

In another implementation, the sensor 116 is an accelerometer. For example, a 3-axis accelerometer sensor (not shown) can be mounted on the PCB substrate 112, with electrical connections accessible to the controller 114, to measure the acceleration (e.g., g's).

Figure 14:
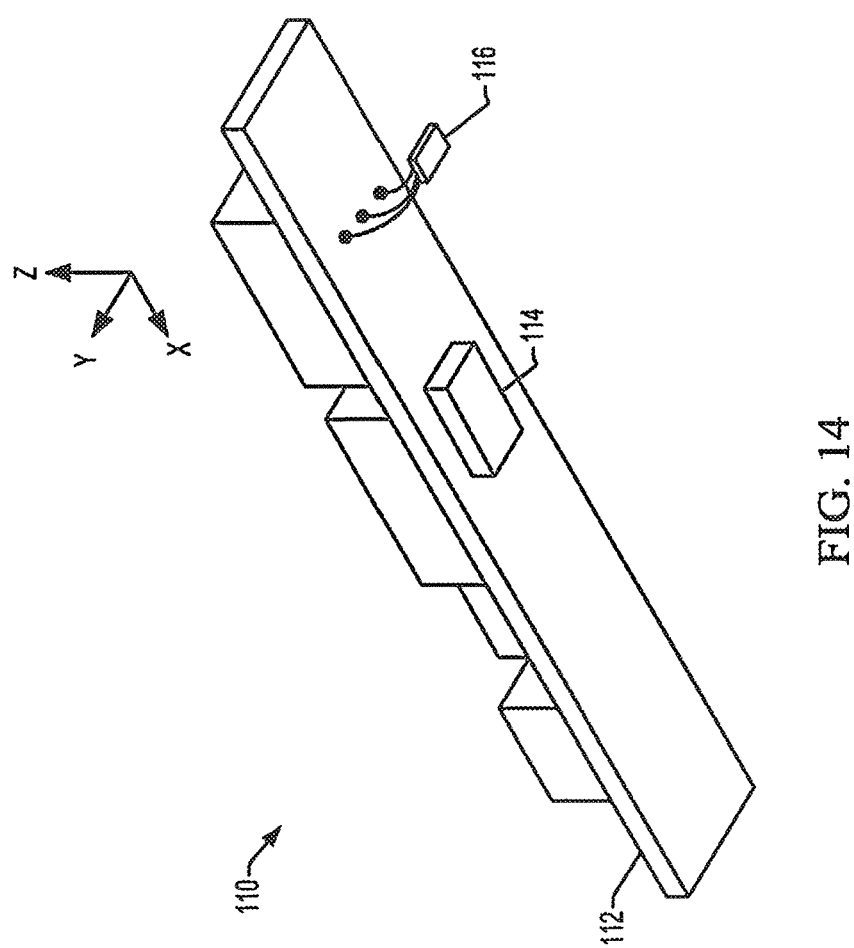
FIG. 14 is a bottom perspective view of another detonator with an integrated sensor wired to a printed circuit board substrate.

Referring also to FIGS. 10-14, FIGS. 10-13 show one implementation of the detonator 110 that includes an enclosure 1000. In certain examples, the enclosure can be a molded plastic shell (e.g., a clamshell design, or other plastic enclosure). In the example of FIGS. 10-13, the enclosure is or includes a heat shrink tubing structure 1000 that encloses the controller 114, the sensor 116, and at least a portion of the substrate 112. As seen in FIGS. 14, moreover, the integrated sensor 116 can be wired to the circuitry of the PCB substrate 112, although not directly mounted to the PCB 112. In certain implementations, a wired environmental sensor 116 is preferably included within the enclosure 1000 (e.g., at least partially inside the heat shrink tubing enclosure 1000 in FIGS. 10-13).

The described integrated sensor implementations provide onboard environmental sensing for an electronic or other type of detonator 110. The onboard accurate temperature reading facilitates intelligent operation of the detonator and the overall blasting system. For example, if a sensor 116 indicates an elevated detonator temperature, either at the high range of specifications or even exceeding the specified operating temperature limits, the system or operators thereof can make judicious decision regarding whether to allow blasting operations such as charging or firing. In one particular example, for a detonator with electronics having a rated operating temperature range of −40° C. to 85° C., if a temperature sensor 116 measures 95° C. in the electronic detonator 110, the local master controller 114 and/or the remote master controller 101 (e.g., or an operator) can then decide whether to allow charging or even firing of the detonator 110 with the currently designated delay times. Current leakage, MOSFET Rdson and voltage regulator output changes with temperature, and the higher temperature may impact reliability of charging or all-fire conditions. Thus, other examples include the controller 114 measuring a voltage regulator output voltage to infer detonator temperature. Measuring the detonator temperature in the presence of elevated temperature environment can help in the reliability of the system. In other implementations, the environmental sensor 116 can be integrated in the controller 114, for example, an internal temperature sensor inside the controller 114. For example, Microchip IC12LF552 or Atmel ATtiny25 contain an internal temperature measurement channel. In certain implementations, the integrated sensor 116 can be used to detect presence of hot holes whereby the mineral sulfides are reacting in exothermic reactions causing temperature rise in boreholes. Such elevated temperature and rise rate in temperature can be used to detect this condition. A background check is done in the background in one example, and the controller 114 raises an alert if the temperature or rise of temperature exceeds a certain limit to transmit to the user when communicating. The transmission of the temp/accelerometer/pressure data from inside the detonator 110 can also be implemented via wireless means, directly to the remote master controller 101 or via intermediary wireless nodes. In addition, the use piezoelectric electric sensors, such as a resistor a capacitor for sensing pressure, allows contemporaneous use of the piezoelectric component for energy harvesting, for example, to facilitate charging firing energy to firing capacitors to enhance firing reliability.

The example embodiments have been described with reference to the preferred embodiments. Modifications and alterations will occur to others upon reading and understanding the preceding detailed description. It is intended that the exemplary embodiment be construed as including all such modifications and alterations insofar as they come within the scope of the appended claims or the equivalents thereof. The above examples are merely illustrative of several possible embodiments of various aspects of the present disclosure, wherein equivalent alterations and/or modifications will occur to others skilled in the art upon reading and understanding this specification and the annexed drawings. In particular regard to the various functions performed by the above described components (assemblies, devices, systems, circuits, and the like), the terms (including a reference to a "means") used to describe such components are intended to correspond, unless otherwise indicated, to any component, such as hardware, processor-executed software and/or firmware, or combinations thereof, which performs the specified function of the described component (i.e., that is functionally equivalent), even though not structurally equivalent to the disclosed structure which performs the function in the illustrated implementations of the disclosure. In addition, although a feature of the disclosure may have been disclosed with respect to only one of several implementations, such feature may be combined with one or more other features of the other implementations as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising."

The following is claimed:

1. A detonator, comprising:
a substrate;
a first terminal mounted to the substrate and configured to be coupled to a first leg wire;
a second terminal mounted to the substrate and configured to be coupled to a second leg wire;
a controller mounted to the substrate, the controller coupled to the first and second terminals;
a sensor coupled to the controller and configured to make at least one reading of an environmental parameter;
wherein the sensor is inside an enclosure of the detonator; and
wherein the controller is configured to initiate environmental parameter readings and communicate such readings to a remote master controller.

2. The detonator of claim 1, wherein the sensor includes a sensor output coupled to an input of the controller.

3. The detonator of claim 2, wherein the controller includes an analog to digital converter configured to convert a signal from the sensor output.

4. The detonator of claim 3, wherein the sensor is a temperature sensor.

5. The detonator of claim 4, wherein the sensor includes:
a first resistor having a first terminal coupled to a sensor input of the sensor, and a second terminal coupled to the sensor output; and
a thermistor having a first terminal coupled to the sensor input, and a second terminal coupled to a reference node.

6. The detonator of claim 3, wherein the sensor is a pressure sensor.

7. The detonator of claim 6, wherein the sensor includes:
a piezoelectric component having a first terminal, and a second terminal; and
a diode circuit, including:
a first diode having an anode coupled to a reference node, and a cathode coupled to the sensor input,
a second diode having an anode coupled to the sensor input, and a cathode coupled to the sensor output,
a third diode having an anode coupled to the second terminal of the piezoelectric component, and a cathode coupled wo the sensor output, and
a fourth diode having an anode coupled to the reference node, and a cathode coupled to the second terminal of the piezoelectric component.

8. The detonator of claim 1, wherein:
the substrate is a printed circuit board; and
the sensor is mounted to the substrate.

9. The detonator of claim 8, wherein the enclosure encloses the controller, the sensor, and a portion of the substrate.

10. The detonator of claim 9, wherein the enclosure includes heat shrink tubing.

11. The detonator of claim 1, wherein the enclosure encloses the controller, the sensor, and a portion of the substrate.

12. The detonator of claim 11, wherein the enclosure includes heat shrink tubing.

13. The detonator of claim 1, wherein the sensor is an accelerometer.

14. A method comprising:
using a sensor inside an enclosure of a detonator, measuring an environmental parameter of the detonator;
using a controller of the detonator, to perform the functions of:
transmitting the measured environmental parameter from the detonator to a remote master controller, and
executing an action in response to a value of the measured environmental parameter,
the method further comprising, using the controller for preventing or modifying the at least one detonator function in response to the value of the measured environmental parameter.

15. The method of claim 14 comprising:
using the controller, determining whether an environmental profile has been reached based on multiple samples of the measured environmental parameter; and
using the controller in response to the environmental profile having been reached, at least one of: executing the action and preventing or modifying the at least one detonator function.

16. The method of claim 14, wherein the measured environmental parameter is a rate of change.

17. The method of claim 14, wherein the controller of the detonator transmits a warning signal.

18. A detonator, comprising:
a substrate;
a first terminal mounted to the substrate and configured to be coupled to a first leg wire;
a second terminal mounted to the substrate and configured to be coupled to a second leg wire;
a controller mounted to the substrate, the controller coupled to the first and second terminals;
a sensor coupled to the controller and configured to make at least one reading of an environmental parameter, the sensor being inside an enclosure of the detonator; and
wherein the controller is configured to transmit a warning signal or an error message.

* * * * *